(12) United States Patent
Yamaura

(10) Patent No.: US 8,502,306 B2
(45) Date of Patent: Aug. 6, 2013

(54) SEMICONDUCTOR DEVICE

(75) Inventor: Kazuaki Yamaura, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/424,150

(22) Filed: Mar. 19, 2012

(65) Prior Publication Data

US 2013/0075815 A1 Mar. 28, 2013

(30) Foreign Application Priority Data

Sep. 22, 2011 (JP) ................................. 2011-207280

(51) Int. Cl.
*H01L 29/76* (2006.01)
*H01L 31/113* (2006.01)

(52) U.S. Cl.
USPC ........... 257/330; 257/331; 257/332; 257/335; 257/341; 257/342; 438/259; 438/270

(58) Field of Classification Search
USPC .......... 257/330–332, 335, 341–343, E29.197; 438/259, 270
See application file for complete search history.

(56) References Cited

U.S. PATENT DOCUMENTS

| | | | |
|---|---|---|---|
| 5,134,448 A * | 7/1992 | Johnsen et al. | ................ 257/330 |
| 2006/0038224 A1 | 2/2006 | Shibib et al. | |
| 2009/0114980 A1 | 5/2009 | Pang | |
| 2009/0166736 A1 | 7/2009 | Park | |
| 2009/0283825 A1 | 11/2009 | Wang et al. | |
| 2010/0078715 A1* | 4/2010 | Lee | ................ 257/330 |

FOREIGN PATENT DOCUMENTS

| | | |
|---|---|---|
| JP | 2003-303959 A | 10/2003 |
| JP | 2004-319741 A | 11/2004 |
| JP | 2008-182106 A | 8/2008 |
| JP | 2009-117828 A | 5/2009 |
| JP | 2009-278100 A | 11/2009 |

* cited by examiner

*Primary Examiner* — Theresa T Doan
(74) *Attorney, Agent, or Firm* — Patterson & Sheridan, LLP

(57) ABSTRACT

According to one embodiment, a semiconductor device includes a semiconductor substrate and a first semiconductor element provided on the semiconductor substrate. The first semiconductor element includes: a first semiconductor; a second semiconductor layer; a third semiconductor layer; a first insulating layer; a first base region; a first source region; a first gate electrode; a first drift layer; a first drain region; a first source; and a first drain electrode. A concentration of an impurity element of the first conductivity type included in the first drift layer is lower than a concentration of an impurity element of the first conductivity type included in the first semiconductor layer. The concentration of the impurity element of the first conductivity type included in the first drift layer is higher than a concentration of an impurity element of the first conductivity type included in the second semiconductor layer.

20 Claims, 6 Drawing Sheets

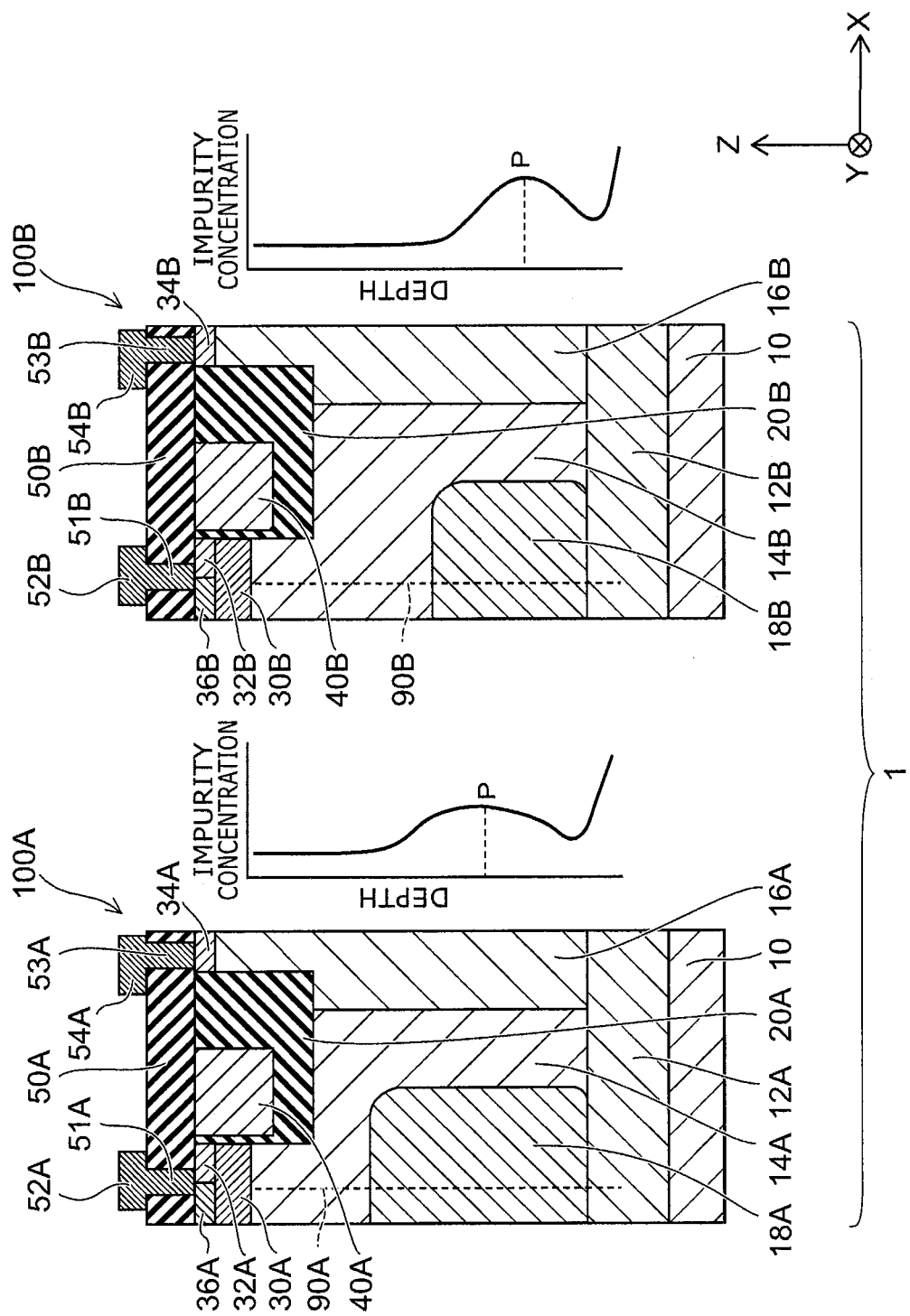

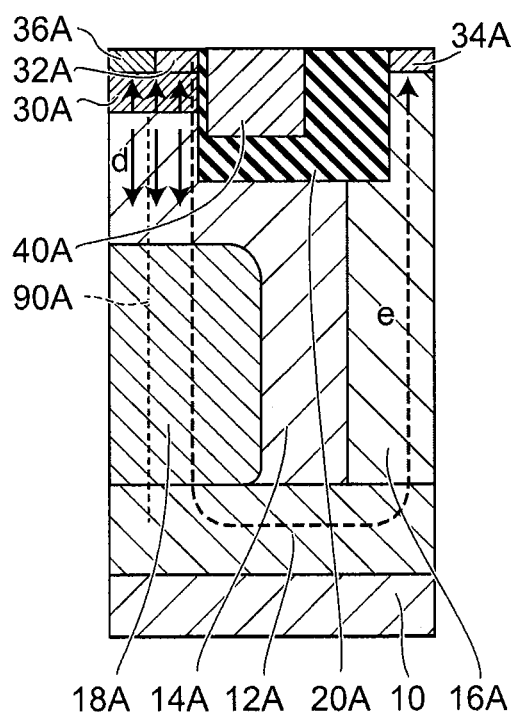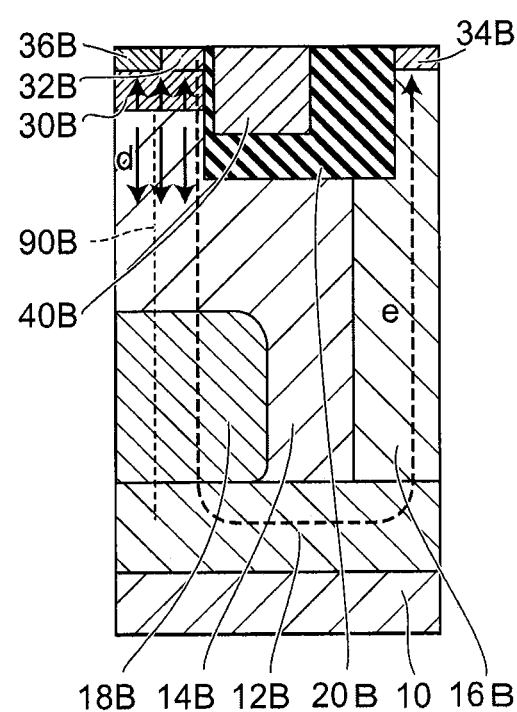

SEMICONDUCTOR DEVICE

CROSS-REFERENCE TO RELATED APPLICATIONS

This application is based upon and claims the benefit of priority from the prior Japanese Patent Application No. 2011-207280, filed on Sep. 22, 2011; the entire contents of which are incorporated herein by reference.

FIELD

Embodiments described herein relate generally to a semiconductor device.

BACKGROUND

A lateral DMOS (Double Diffused Metal Oxide Semiconductor) field effect transistor is one example of a power MOS (Metal Oxide Semiconductor) field effect transistor. Generally, in a DMOS field effect transistor, measures are taken to increase the breakdown voltage of the element by increasing the length (the drift length) of the drift region.

However, in the case where measures are taken to increase the drift length as recited above to increase the breakdown voltage of the element, the element surface area of the lateral DMOS field effect transistor undesirably increases.

BRIEF DESCRIPTION OF THE DRAWINGS

FIGS. 2A and 2B are schematic cross-sectional views of the semiconductor device according to the embodiment, FIGS. 3A and 3B are schematic cross-sectional views illustrating effects of the semiconductor device according to the embodiment;

DETAILED DESCRIPTION

Figure 1:
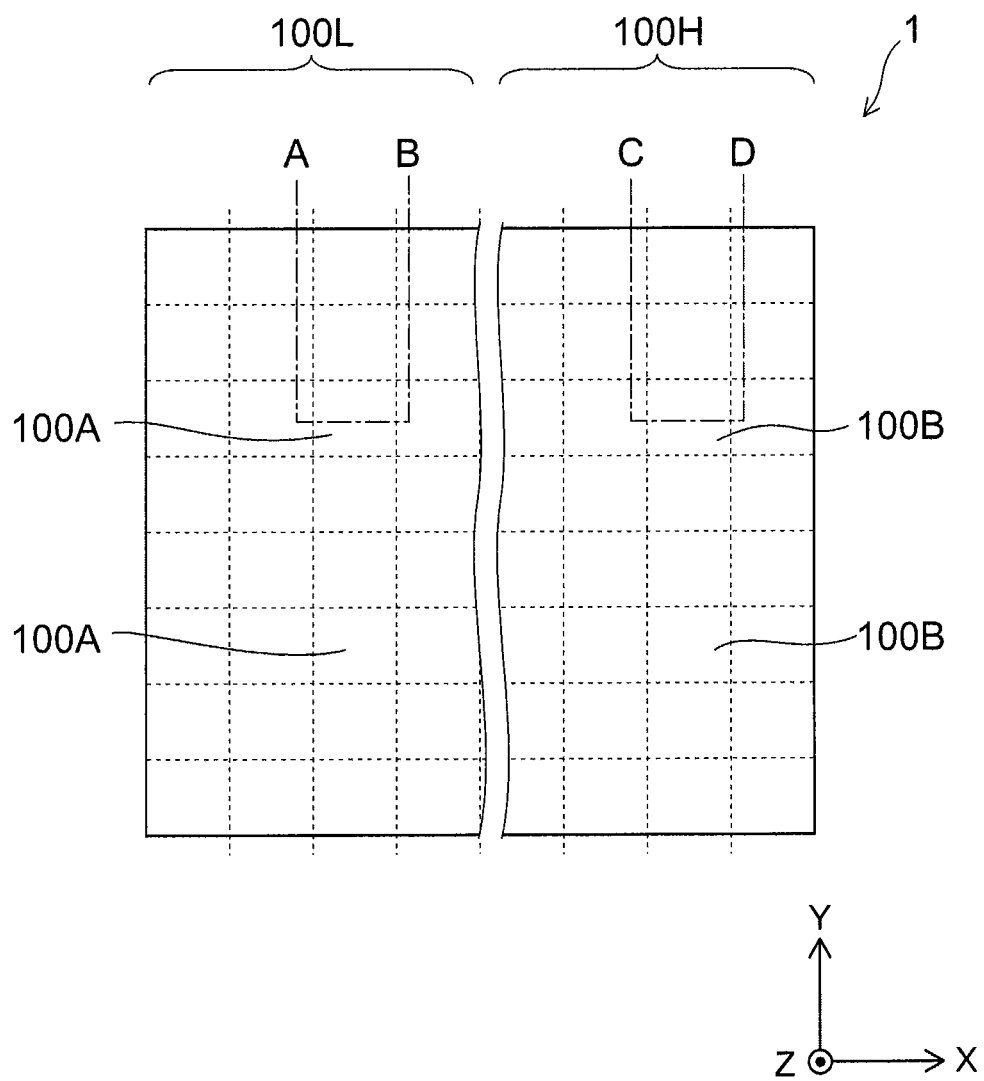
FIG. 1 is a schematic plan view of the semiconductor device according to an embodiment.

In general, according to one embodiment, a semiconductor device includes a semiconductor substrate and a first semiconductor element provided on the semiconductor substrate. The first semiconductor element includes: a first semiconductor layer of a first conductivity type provided on the semiconductor substrate; a second semiconductor layer of the first conductivity type provided on the first semiconductor layer; a third semiconductor layer of the first conductivity type provided on the first semiconductor layer to be adjacent to the second semiconductor layer; a first insulating layer provided from a surface of the second semiconductor layer into an interior of the second semiconductor layer and from a surface of the third semiconductor layer into an interior of the third semiconductor layer; a first base region of a second conductivity type selectively provided on the surface of the second semiconductor layer; a first source region of the first conductivity type selectively provided on a surface of the first base region; a first gate electrode provided from a surface of the first insulating layer into an interior of the first insulating layer, the first gate electrode being adjacent to the first base region with the first insulating layer interposed; a first drift layer of the first conductivity type provided inside the second semiconductor layer under the first base region to extend from a surface of the first semiconductor layer toward the first base region side; a first drain region of the first conductivity type provided on the surface of the third semiconductor layer to oppose the first source region with the first insulating layer interposed; a first source electrode electrically connected to the first source region; and a first drain electrode electrically connected to the first drain region. A concentration of an impurity element of the first conductivity type included in the first drift layer is lower than a concentration of an impurity element of the first conductivity type included in the first semiconductor layer. The concentration of the impurity element of the first conductivity type included in the first drift layer is higher than a concentration of an impurity element of the first conductivity type included in the second semiconductor layer.

An embodiment will now be described with reference to the drawings. In the description recited below, similar members are marked with like reference numerals, and a description of a member once described is omitted as appropriate.

FIG. 1 is a schematic plan view of the semiconductor device according to the embodiment.

FIGS. 2A and 2B are schematic cross-sectional views of the semiconductor device according to the embodiment.

FIG. 2A illustrates a cross section of FIG. 1 at the position along line A-B; and FIG. 2B illustrates a cross section of FIG. 1 at the position along line C-D.

As illustrated in FIG. 1, the semiconductor device 1 includes semiconductor elements (first semiconductor elements) 100A and semiconductor elements (second semiconductor elements) 100B. The semiconductor elements 100A and the semiconductor elements 100B are provided in cell units (the portions enclosed with the rectangular broken lines). In the semiconductor device 1, the semiconductor elements 100A are periodically arranged lengthwise and crosswise in the drawings; and the semiconductor elements 100B are arranged periodically lengthwise and crosswise in the drawings. The breakdown voltage of the semiconductor element 100A is different from the breakdown voltage of the semiconductor element 100B. In other words, the semiconductor device 1 includes two types of semiconductor elements that have different breakdown voltages.

For example, the breakdown voltage of the semiconductor element 100B is higher than the breakdown voltage of the semiconductor element 100A. The region where the semiconductor elements 100A are disposed is taken as a low breakdown voltage element region 100L; and the region where the semiconductor elements 100B are disposed is taken as a high breakdown voltage element region 100H.

First, the cross-sectional structure of the semiconductor element 100A will be described.

The semiconductor element 100A illustrated in FIG. 2A is a lateral DMOS field effect transistor and has a trench gate structure.

In the semiconductor element 100A, an $n^+$-type first semiconductor layer 12A is provided on a p-type semiconductor substrate 10. An $n^-$-type second semiconductor layer 14A is provided on the first semiconductor layer 12A. An $n^+$-type third semiconductor layer 16A is provided on the first semiconductor layer 12A to be adjacent to the second semiconductor layer 14A. A first insulating layer 20A is provided from the surface of the second semiconductor layer 14A into the interior of the second semiconductor layer 14A and from the surface of the third semiconductor layer 16A into the interior of the third semiconductor layer 16A.

In the semiconductor element 100A, a p-type first base region 30A is selectively provided on the surface of the second semiconductor layer 14A. An n$^+$-type first source region 32A is selectively provided on the surface of the first base region 30A. A first gate electrode 40A is provided from the surface of the first insulating layer 20A into the interior of the first insulating layer 20A. The first gate electrode 40A is adjacent to the first base region 30A with the first insulating layer 20A interposed.

The first insulating layer 20A which is provided between the first gate electrode 40A and the first base region 30A functions as a gate insulating film. The thickness of the first insulating layer 20A provided between the first gate electrode 40A and the second semiconductor layer 14A and the thickness of the first insulating layer 20A provided between the first gate electrode 40A and the third semiconductor layer 16A are thicker than the thickness of the first insulating layer 20A provided between the first gate electrode 40A and the first base region 30A. Thereby, the semiconductor element 100A has a high breakdown voltage due to the existence of the first insulating layer 20A even in the case where a strong electric field is applied between the first gate electrode 40A and a first drain region 34A described below.

In the semiconductor element 100A, an n-type first drift layer 18A is provided inside the second semiconductor layer 14A under the first base region 30A. The first drift layer 18A extends from the surface of the first semiconductor layer 12A toward the first base region 30A side. The n$^+$-type first drain region 34A is provided on the surface of the third semiconductor layer 16A. The first drain region 34A opposes the first source region 32A with the first insulating layer 20A interposed. A first back gate region 36A is provided on the surface of the first base region 30A to be adjacent to the first source region 32A. The back gate region 36A functions as a carrier release region.

A first inter-layer insulating film 50A is provided on the first back gate region 36A, on the first source region 32A, on the first insulating layer 20A, on the first gate electrode 40A, and on the first drain region 34A.

In the semiconductor element 100A, a first source electrode 52A is electrically connected to the first source region 32A and the first back gate region 36A via a first source contact 51A. A first drain electrode 54A is electrically connected to the first drain region 34A via a first drain contact 53A.

The concentration of the n-type impurity element included in the first drift layer 18A is lower than the concentration of the n-type impurity element included in the first semiconductor layer 12A. The concentration of the n-type impurity element included in the first drift layer 18A is higher than the concentration of the n-type impurity element included in the second semiconductor layer 14A.

For example, the right side of FIG. 2A illustrates the n-type impurity element concentration profile at positions along line 90A. The vertical axis of the impurity element concentration profile is the depth; and the horizontal axis is the impurity concentration.

For example, the concentration of the impurity element of the second semiconductor layer 14A is substantially constant in the depth direction (the Z-axis direction). In the first drift layer 18A, the concentration of the impurity element increases once toward the first semiconductor layer 12A. Then, the concentration of the impurity element conversely decreases toward the first semiconductor layer 12A side. In other words, the impurity element concentration profile of the first drift layer 18A has a peak P. The concentration of the impurity element of the first semiconductor layer 12A is higher than the concentrations of the impurity elements of the second semiconductor layer 14A and the first drift layer 18A.

In other words, the peak value of the n-type impurity element concentration profile included in the first drift layer 18A is lower than the concentration of the n-type impurity element included in the first semiconductor layer 12A. The peak value of the n-type impurity element concentration profile included in the first drift layer 18A is higher than the concentration of the n-type impurity element included in the second semiconductor layer 14A.

It is unnecessary for the peak P of the impurity element concentration profile of the first drift layer 18A to be one peak. The peak P may be multiple. In such a case as well, one peak value of the multiple peaks P is lower than the concentration of the n-type impurity element included in the first semiconductor layer 12A and higher than the concentration of the n-type impurity element included in the second semiconductor layer 14A.

The cross-sectional structure of the semiconductor element 100B will now be described.

The semiconductor element 100B illustrated in FIG. 2B is a lateral DMOS field effect transistor and has a trench gate structure.

In the semiconductor element 100B, an n$^+$-type fourth semiconductor layer 12B is provided on the semiconductor substrate 10. An n$^-$-type fifth semiconductor layer 14B is provided on the fourth semiconductor layer 12B. An n$^+$-type sixth semiconductor layer 16B is provided on the fourth semiconductor layer 12B to be adjacent to the fifth semiconductor layer 14B. A second insulating layer 20B is provided from the surface of the fifth semiconductor layer 14B into the interior of the fifth semiconductor layer 14B and from the surface of the sixth semiconductor layer 16B into the interior of the sixth semiconductor layer 16B.

In the semiconductor element 100B, a p-type second base region 30B is selectively provided on the surface of the fifth semiconductor layer 14B. An n$^+$-type second source region 32B is selectively provided on the surface of the second base region 30B. A second gate electrode 40B is provided from the surface of the second insulating layer 20B into the interior of the second insulating layer 20B. The second gate electrode 40B is adjacent to the second base region 30B with the second insulating layer 20B interposed.

The second insulating layer 20B provided between the second gate electrode 40B and the second base region 30B functions as a gate insulating film. The thickness of the second insulating layer 20B provided between the second gate electrode 40B and the fifth semiconductor layer 14B and the thickness of the second insulating layer 20B provided between the second gate electrode 40B and the sixth semiconductor layer 16B are thicker than the thickness of the second insulating layer 20B provided between the second gate electrode 40B and the second base region 30B.

In the semiconductor element 1008, an n-type second drift layer 18B is provided under the second base region 30B. The second drift layer 18B extends from the surface of the fourth semiconductor layer 12B toward the second base region 30B side. An n$^+$-type second drain region 34B is provided on the surface of the sixth semiconductor layer 16B. The second drain region 34B opposes the second source region 32B with the second insulating layer 20B interposed. A second back gate region 36B is provided on the surface of the second base region 30B to be adjacent to the second source region 32B. The second back gate region 36B functions as a carrier release region.

A second inter-layer insulating film 50B is provided on the second back gate region 36B, on the second source region 32B, on the second insulating layer 20B, on the second gate electrode 40B, and on the second drain region 34B.

In the semiconductor element 100B, a second source electrode 52B is electrically connected to the second source region 32B and the second back gate region 36B via a second source contact 51B. A second drain electrode 54B is electrically connected to the second drain region 34B via a second drain contact 53B.

The concentration of the n-type impurity element included in the second drift layer 18B is lower than the concentration of the n-type impurity element included in the fourth semiconductor layer 12B. The concentration of the n-type impurity element included in the second drift layer 18B is higher than the concentration of the n-type impurity element included in the fifth semiconductor layer 14B.

For example, the right side of FIG. 2B illustrates the n-type impurity element concentration profile at positions along line 90B. The vertical axis of the impurity element concentration profile is the depth; and the horizontal axis is the impurity concentration.

For example, the concentration of the impurity element of the fifth semiconductor layer 14B is substantially constant in the depth direction. In the second drift layer 18B, the concentration of the impurity element increases once toward the fourth semiconductor layer 12B. Then, the concentration of the impurity element conversely decreases toward the fourth semiconductor layer 12B side. In other words, the impurity element concentration profile of the second drift layer 18B has the peak P. The concentration of the impurity element of the fourth semiconductor layer 12B is higher than the concentrations of the impurity elements of the fifth semiconductor layer 14B and the second drift layer 18B.

In other words, the peak value of the n-type impurity element concentration profile included in the second drift layer 18B is lower than the concentration of the n-type impurity element included in the fourth semiconductor layer 12B. The peak value of the n-type impurity element concentration profile included in the second drift layer 18B is higher than the concentration of the n-type impurity element included in the fifth semiconductor layer 14B.

It is unnecessary for the peak P of the impurity element concentration profile of the second drift layer 18B to be one peak. The peak P may be multiple. In such a case as well, one peak value of the multiple peaks P is lower than the concentration of the n-type impurity element included in the fourth semiconductor layer 12B and higher than the concentration of the n-type impurity element included in the fifth semiconductor layer 14B.

In the semiconductor device 1, the thickness of the first drift layer 18A is different from the thickness of the second drift layer 18B. Alternatively, the concentration of the n-type impurity element included in the first drift layer 18A is different from the concentration of the n-type impurity element included in the second drift layer 18B. The configuration of the semiconductor element 100A other than the first drift layer 18A is the same as the configuration of the semiconductor element 100B other than the second drift layer 18B.

In the semiconductor device 1, the element size of the semiconductor element 100A is the same as the element size of the semiconductor element 100B. For example, the distance from the first base region 30A to the third semiconductor layer 16A is the same as the distance from the second base region 30B to the sixth semiconductor layer 16B.

The first drift layer 18A and the second drift layer 18B are formed by, for example, ion implantation. The thickness and the impurity concentration can be changed between the first drift layer 18A and the second drift layer 18B by changing the ion implantation conditions (the acceleration, the dose, etc.) between the first drift layer 18A and the second drift layer 18B.

The main component of the semiconductor element 100A other than the first insulating layer 20A is, for example, silicon (Si). The material of the first insulating layer 20A is, for example, silicon oxide ($SiO_2$). The main component of the semiconductor element 100B other than the second insulating layer 20B is, for example, silicon (Si). The material of the second insulating layer 20B is, for example, silicon oxide ($SiO_2$).

In the embodiment, there are cases where the $n^+$ type, the $n^-$ type, and the n type are referred to collectively as the first conductivity type, and the $p^+$ type and the p type are referred to collectively as the second conductivity type. The $n^+$ type means that the concentration of the n-type impurity is higher than that of the n type; and the $n^-$ type means that the concentration of the n-type impurity is lower than that of the n type. The $p^+$ type means that the concentration of the p-type impurity is higher than that of the p type. Phosphorus (P), arsenic (As), and the like are examples of the impurity element of the first conductivity type. Boron (B) and the like are examples of the impurity element of the second conductivity type. Generally, the resistivity of the semiconductor layer decreases as the impurity concentration increases.

The first semiconductor layer 12A and the fourth semiconductor layer 12B may be referred to as $n^+$-type buried layers. The second semiconductor layer 14A and the fifth semiconductor layer 14B may be referred to as epitaxial layers. The third semiconductor layer 16A and the sixth semiconductor layer 16B may be referred to as drain deep $n^+$ layers. The first base region 30A and the second base region 30B may be referred to as channel diffusion layers. The thicknesses of the second semiconductor layer 14A and the fifth semiconductor layer 14B are, for example, 5 µm. The thicknesses of the first insulating layer 20A and the second insulating layer 20B are, for example, 1.2 µm.

Thus, the semiconductor device 1 includes the semiconductor elements 100A and the semiconductor elements 100B on the same semiconductor substrate 10.

Effects of the semiconductor device 1 will now be described.

FIGS. 3A and 3B are schematic cross-sectional views illustrating effects of the semiconductor device according to the embodiment.

FIG. 3A illustrates the semiconductor element 100A; and FIG. 3B illustrates the semiconductor element 100B.

For example, in the semiconductor element 100A, the potential difference between the first source region 32A and the first gate electrode 40A is a voltage that is lower than the threshold; and a positive voltage (a reverse-biased voltage) with respect to the first source region 32A is applied to the first drain region 34A. Then, a depletion layer extends from the junction portion (the pn junction interface) between the second semiconductor layer 14A and the first base region 30A into the second semiconductor layer 14A side and the first base region 30A side. The appearance of the extension of the depletion layer is illustrated in the drawings by arrows d. In such a case, the carriers are driven out of the second semiconductor layer 14A and the first base region 30A; and the semiconductor element 100A is switched to the off-state. In the off-state, a current does not flow between the first source region 32A and the first drain region 34A.

On the other hand, in the case where a positive voltage with respect to the first source region 32A is applied to the first drain region 34A and the potential difference between the first source region 32A and the first gate electrode 40A is a voltage that is higher than the threshold, an inversion layer is formed in the first base region 30A proximal to the first insulating layer 20A; and a channel is formed in the first base region 30A. In such a case, the semiconductor element 100A is switched to the on-state. Here, the current tends to flow as much as possible through the semiconductor layers that have low resistivity. In other words, the current flows through the path of the first source region 32A/channel region/second semiconductor layer 14A/first drift layer 18A/first semiconductor layer 12A/third semiconductor layer 16A/first drain region 34A. That is, the current flows between the first source region 32A and the first drain region 34A.

For example, the flow of the electron current is illustrated by the broken-line arrow e in the drawings. The electron current flows downward from the first source region 32A and reaches the first semiconductor layer 12A. Continuing, the electron current proceeds through the first semiconductor layer 12A substantially parallel to the major surface of the first semiconductor layer 12A. Subsequently, the electron current flows upward from the first semiconductor layer 12A and reaches the first drain region 34A. The effects of the semiconductor element 100B are similar to those of the semiconductor element 100A.

However, when it is assumed that the impurity concentration of the second drift layer 18B is the same as the impurity concentration of the first drift layer 18A, the depletion layer d extends more easily in the semiconductor element 100B than in the semiconductor element 100A in the off-state by the amount that the thickness of the second drift layer 18B is thinner than the thickness of the first drift layer 18A. Also, the on-resistance of the semiconductor element 100B is higher than that of the semiconductor element 100A by the amount that the thickness of the second drift layer 18B is thinner than the thickness of the first drift layer 18A. In other words, the breakdown voltage and the on-resistance of the semiconductor element 100B are higher than those of the semiconductor element 100A. In the semiconductor elements according to the embodiment, the breakdown voltage and the on-resistance can be adjusted by changing only the thicknesses of the drift layers.

In other words, in the semiconductor device 1, semiconductor elements (the semiconductor element 100A and the semiconductor element 100B) having the same element size and different breakdown voltages and on-resistances can be provided together on the same semiconductor substrate 10. In other words, an increase of the size of the semiconductor device 1 can be suppressed even in the case where the semiconductor element 100A which has the low breakdown voltage and the semiconductor element 100B which has the high breakdown voltage are provided together on the same semiconductor substrate 10.

Figure 4A:
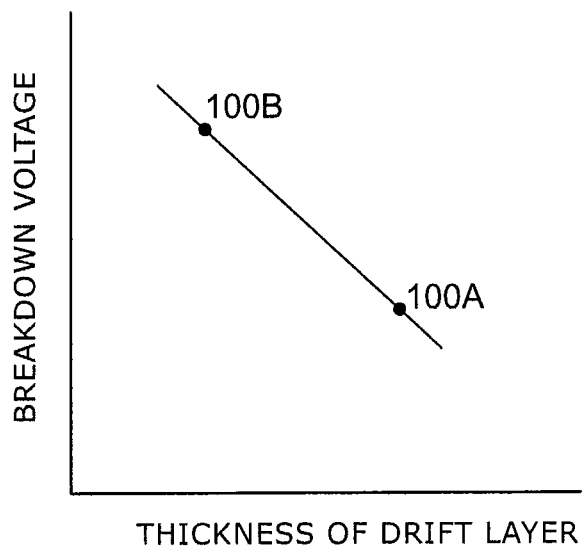
FIG. 4A illustrates the relationship between the thickness of a drift layer and a breakdown voltage.
Figure 4B:
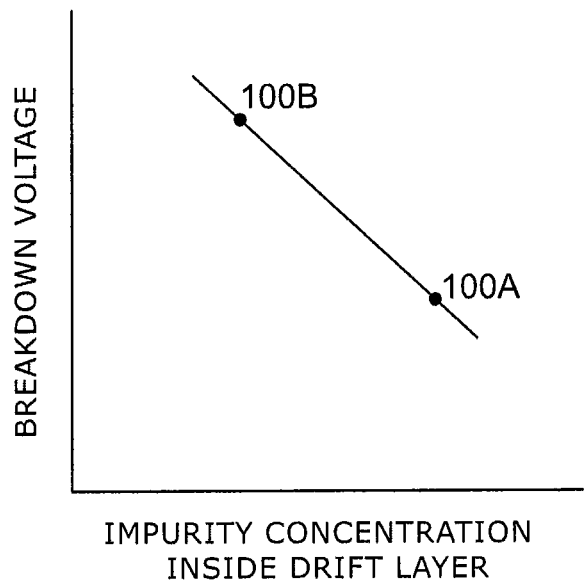
FIG. 4B illustrates a relationship between an impurity concentration inside the drift layer and the breakdown voltage.

FIGS. 4A and 4B illustrate the relationships of the breakdown voltage with the thickness of the drift layer and the impurity concentration inside the drift layer.

FIG. 4A illustrates the relationship between the thickness of the drift layer and the breakdown voltage when it is assumed that the impurity concentrations inside the drift layers are the same. As described above, the breakdown voltage tends to decrease as the thickness of the drift layer increases.

FIG. 4B illustrates the relationship between the impurity concentration inside the drift layer and the breakdown voltage when it is assumed that the thicknesses of the drift layers are the same. Even in the case where the thicknesses of the drift layers are the same, the breakdown voltages of the semiconductor elements can be changed by changing the impurity concentrations included inside the drift layers.

For example, the thickness of the first drift layer 18A is the same as the thickness of the second drift layer 18B, and the impurity concentration included inside the second drift layer 18B is lower than the impurity concentration included inside the first drift layer 18A. Thereby, breakdown due to avalanche breakdown occurs less easily inside the semiconductor element 100B than inside the semiconductor element 100A. As a result, the breakdown voltage of the semiconductor element 100B is higher than the breakdown voltage of the semiconductor element 100A.

Because the breakdown voltage and the on-resistance run counter to each other, the on-resistance of the semiconductor element increases when the breakdown voltage of the semiconductor element increases.

The first drift layer 18A and the second drift layer 18B are formed by separate photolithography processes and ion implantation.

Figure 5A:
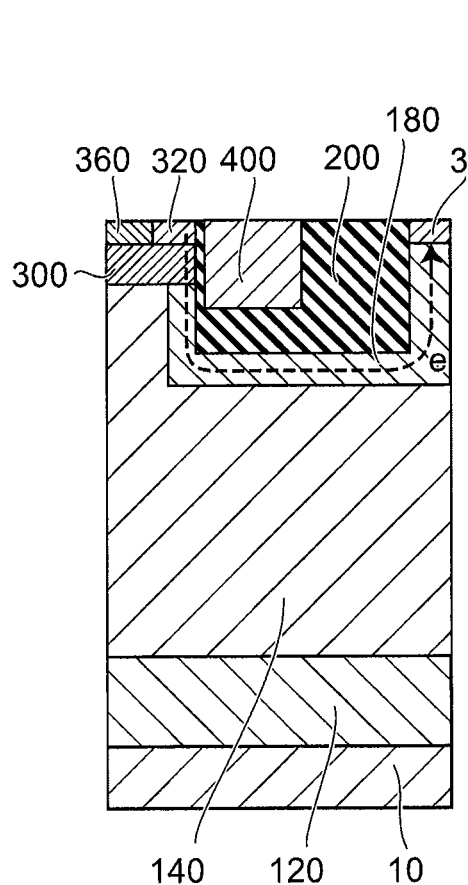
FIGS. 5A and 5B are schematic cross-sectional views illustrating effects of a semiconductor device according to a reference example.
Figure 5B:
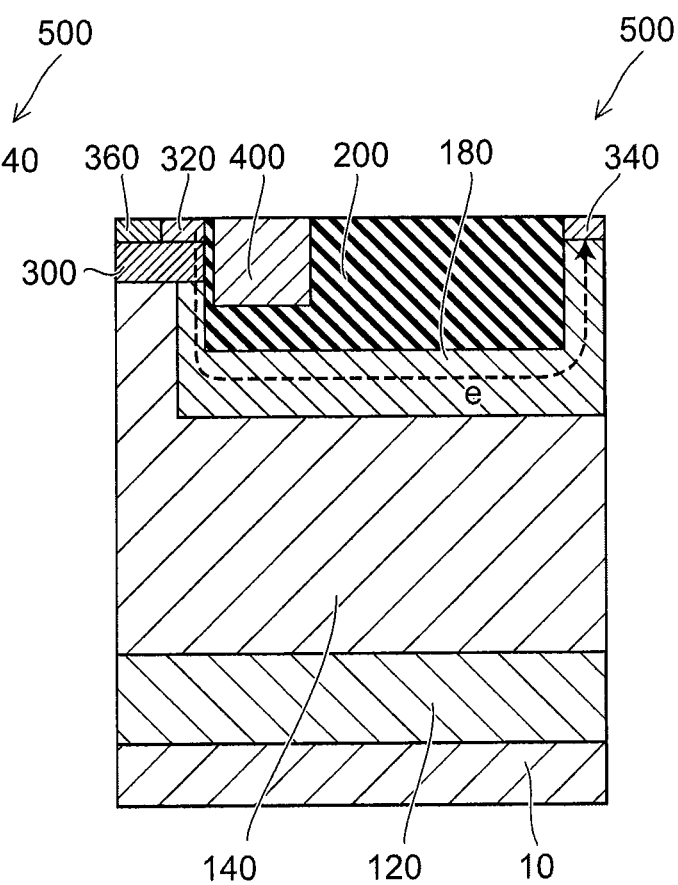

Conversely, FIGS. 5A and 5B are schematic cross-sectional views illustrating effects of a semiconductor device according to a reference example.

In the semiconductor element 500 according to the reference example as illustrated in FIG. 5A, an $n^+$-type semiconductor layer 120 is provided on the semiconductor substrate 10. An $n^-$-type semiconductor layer 140 is provided on the semiconductor layer 120. A drift layer 180 is provided from the surface of the semiconductor layer 140 into the interior of the semiconductor layer 140. An insulating layer 200 is provided from the surface of the drift layer 180 into the interior of the drift layer 180.

In the semiconductor element 500, a p-type base region 300 is selectively provided on the surface of the semiconductor layer 140. An $n^+$-type source region 320 is selectively provided on the surface of the base region 300. A gate electrode 400 is provided from the surface of the insulating layer 200 into the interior of the insulating layer 200. The gate electrode 400 is adjacent to the base region 300 with the insulating layer 200 interposed. The insulating layer 200 that is provided between the gate electrode 400 and the base region 300 functions as a gate insulating film.

In the semiconductor element 500, an $n^+$-type drain region 340 is provided on the surface of the semiconductor layer 140. The drain region 340 opposes the source region 320 with the insulating layer 200 interposed. A back gate region 360 is provided on the surface of the base region 300 to be adjacent to the source region 320.

In the semiconductor element 500, the drift layer 180 does not extend from the surface of the semiconductor layer 120 toward the base region 300 side. The drift layer 180 is formed to cover the bottom surface and the side surface of the insulating layer 200.

In the semiconductor element 500, the potential difference between the source region 320 and the gate electrode 400 is a voltage lower than the threshold; and a positive voltage with respect to the source region 320 is applied to the drain region 340. Then, a depletion layer extends from the junction portion (the pn junction interface) between the drift layer 180 and the base region 300 into the drift layer 180 side and the base region 300 side. Also, a depletion layer extends from the junction portion (the pn junction interface) between the semiconductor layer 140 and the base region 300 into the semiconductor layer 140 side and the base region 300 side. In such a case, the carriers are driven out of the drift layer 180 and the base region 300; and the semiconductor element 500 is switched to the off-state. In other words, a current does not flow between the source region 320 and the drain region 340.

On the other hand, in the case where a positive voltage with respect to the source region 320 is applied to the drain region 340 and the potential difference between the source region 320 and the gate electrode 400 is a voltage that is higher than the threshold, an inversion layer is formed in the base region 300 proximal to the insulating layer 200; and a channel is formed in the base region 300. In such a case, the semiconductor element 500 is switched to the on-state. Here, the current tends to flow as much as possible through the semiconductor layers that have low resistivity. In other words, the current flows through the path of the source region 320/channel region/drift layer 180/drain region 340. That is, the current flows between the source region 320 and the drain region 340.

For example, the flow of the electron current is illustrated by the arrow e in the drawings. The electron current flows downward from the source region 32A and reaches the drift layer 180. Continuing, the electron current proceeds through the drift layer 180, subsequently flows upward from the drift layer 180, and reaches the drain region 340.

However, in the semiconductor element 500, the first drift layer 18A (or the second drift layer 18B) described above is not provided. Accordingly, it is necessary to increase the length of the drift layer 180 (the drift length) as illustrated in FIG. 5B to increase the breakdown voltage of the semiconductor element 500. In other words, in the reference example, the size of the semiconductor device undesirably increases in the case where the semiconductor element that has the low breakdown voltage and the semiconductor element that has the high breakdown voltage are provided together on the same semiconductor substrate 10.

Figure 6:
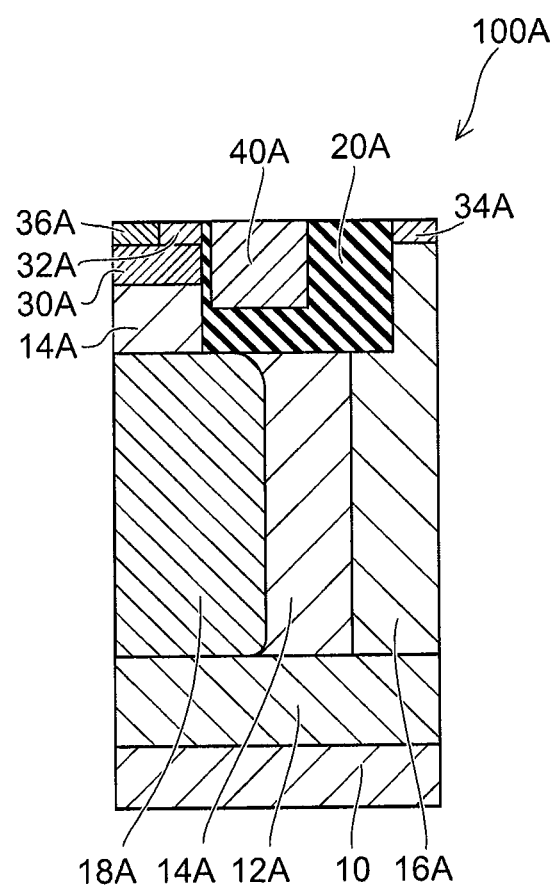
FIG. 6 is a schematic cross-sectional view of a semiconductor device according to a modification of the embodiment.

FIG. 6 is a schematic cross-sectional view of a semiconductor device according to a modification of the embodiment.

In the semiconductor element 100A, the first drift layer 18A may contact a portion of the first insulating layer 20A. In the case of such a mode, a semiconductor element having an even lower breakdown voltage and on-resistance can be provided on the semiconductor substrate 10.

Although a trench-type gate electrode is illustrated in the embodiment, a planar-type gate electrode may be used instead of the trench-type gate electrode. Even in the case where the gate electrode is the planar-type, the electron current flows through the path of the first source region 32A/channel region/second semiconductor layer 14A/first drift layer 18A/first semiconductor layer 12A/third semiconductor layer 16A/first drain region 34A in the on-state. Such a mode also is included in the embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device comprising a semiconductor substrate and a first semiconductor element provided on the semiconductor substrate, the first semiconductor element including:
a first semiconductor layer of a first conductivity type provided on the semiconductor substrate;
a second semiconductor layer of the first conductivity type provided on the first semiconductor layer;
a third semiconductor layer of the first conductivity type provided on the first semiconductor layer to be adjacent to the second semiconductor layer;
a first insulating layer provided from a surface of the second semiconductor layer into an interior of the second semiconductor layer and from a surface of the third semiconductor layer into an interior of the third semiconductor layer;
a first base region of a second conductivity type selectively provided on the surface of the second semiconductor layer;
a first source region of the first conductivity type selectively provided on a surface of the first base region;
a first gate electrode provided from a surface of the first insulating layer into an interior of the first insulating layer, the first gate electrode being adjacent to the first base region with the first insulating layer interposed;
a first drift layer of the first conductivity type provided inside the second semiconductor layer under the first base region to extend from a surface of the first semiconductor layer toward the first base region side;
a first drain region of the first conductivity type provided on the surface of the third semiconductor layer to oppose the first source region with the first insulating layer interposed;
a first source electrode electrically connected to the first source region; and
a first drain electrode electrically connected to the first drain region,
a concentration of an impurity element of the first conductivity type included in the first drift layer being lower than a concentration of an impurity element of the first conductivity type included in the first semiconductor layer,
the concentration of the impurity element of the first conductivity type included in the first drift layer being higher than a concentration of an impurity element of the first conductivity type included in the second semiconductor layer.

2. The device according to claim 1, further comprising a second semiconductor element provided on the semiconductor substrate, the second semiconductor element including:
a fourth semiconductor layer of the first conductivity type provided on the semiconductor substrate;
a fifth semiconductor layer of the first conductivity type provided on the fourth semiconductor layer;
a sixth semiconductor layer of the first conductivity type provided on the fourth semiconductor layer to be adjacent to the fifth semiconductor layer;
a second insulating layer provided from a surface of the fifth semiconductor layer into an interior of the fifth semiconductor layer and from a surface of the sixth semiconductor layer into an interior of the sixth semiconductor layer;
a second base region of the second conductivity type selectively provided on the surface of the fifth semiconductor layer;
a second source region of the first conductivity type selectively provided on a surface of the second base region;
a second gate electrode provided from a surface of the second insulating layer into an interior of the second insulating layer, the second gate electrode being adjacent to the second base region with the second insulating layer interposed;

a second drift layer of the first conductivity type provided inside the fifth semiconductor layer under the second base region to extend from a surface of the fourth semiconductor layer toward the second base region side;
a second drain region of the first conductivity type provided on the surface of the sixth semiconductor layer to oppose the second source region with the second insulating layer interposed;
a second source electrode electrically connected to the second source electrode; and
a second drain electrode electrically connected to the second drain region,
a concentration of an impurity element of the first conductivity type included in the second drift layer being lower than a concentration of an impurity element of the first conductivity type included in the fourth semiconductor layer,
the concentration of the impurity element of the first conductivity type included in the second drift layer being higher than a concentration of an impurity element of the first conductivity type included in the sixth semiconductor layer
the first drift layer has a structure substantially different from the second drift layer.

3. The device according to claim 2, wherein a thickness of the first drift layer is different from a thickness of the second drift layer.

4. The device according to claim 2, wherein the concentration of the impurity element of the first conductivity type included in the first drift layer is different from the concentration of the impurity element of the first conductivity type included in the second drift layer.

5. The device according to claim 1, wherein:
a peak value of an impurity element concentration profile of the first conductivity type included in the first drift layer is lower than the concentration of the impurity element of the first conductivity type included in the first semiconductor layer; and
the peak value of the impurity element concentration profile of the first conductivity type included in the first drift layer is higher than the concentration of the impurity element of the first conductivity type included in the second semiconductor layer.

6. The device according to claim 1, wherein a thickness of the first insulating layer provided between the first gate electrode and the second semiconductor layer and a thickness of the first insulating layer provided between the first gate electrode and the third semiconductor layer are thicker than a thickness of the first insulating layer provided between the first gate electrode and the first base region.

7. The device according to claim 1, wherein the first drift layer does not contact the first insulating layer, or the first drift layer contacts a portion of the first insulating layer.

8. The device according to claim 2, wherein the configuration of the first semiconductor element other than the first drift layer is the same as the configuration of the second semiconductor element other than the second drift layer.

9. The device according to claim 2, wherein a distance from the first base region to the third semiconductor layer is the same as a distance from the second base region to the sixth semiconductor layer.

10. The device according to claim 2, wherein the first semiconductor element is arranged periodically in a plane of the semiconductor substrate, and the second semiconductor element is arranged periodically in the plane of the semiconductor substrate.

11. The device according to claim 2, wherein a low breakdown voltage element region and a high breakdown voltage element region are provided in the semiconductor substrate as viewed from a direction perpendicular to a plane of the semiconductor substrate, the first semiconductor element is disposed in the low breakdown voltage element region, and the second semiconductor element is disposed in the high breakdown voltage element region.

12. The device according to claim 1, wherein a side surface of the first insulating layer on the second semiconductor layer side contacts an upper portion of the second semiconductor layer, and the side surface of the first insulating layer on the third semiconductor layer side contacts the third semiconductor layer.

13. The device according to claim 1, wherein a first back gate region is provided on the first base region to be adjacent to the first source region.

14. The device according to claim 1, wherein a first interlayer insulating film is provided on the first source region, on the first insulating layer, on the first gate electrode, and on the first drain region.

15. The device according to claim 2, wherein a peak of a depth-direction impurity element concentration profile of the second drift layer is deeper than a peak of a depth-direction impurity element concentration profile of the first drift layer.

16. The device according to claim 15, wherein the peaks are multiply provided.

17. The device according to claim 16, wherein one peak value of the plurality of peaks is lower than a concentration of an n-type impurity element included in the first semiconductor layer and higher than a concentration of the n-type impurity element included in the second semiconductor layer.

18. The device according to claim 2, wherein a breakdown voltage of the second semiconductor element is higher than a breakdown voltage of the first semiconductor element.

19. The device according to claim 2, wherein the impurity concentration of the first drift layer is equal to the impurity concentration of the second drift layer, and a thickness of the first drift layer is different from a thickness of the second drift layer.

20. The device according to claim 2, wherein a thickness of the first drift layer is equal to a thickness of the second drift layer, and the impurity concentration of the first drift layer is different from the impurity concentration of the second drift layer.

* * * * *